United States Patent
Yoon et al.

(10) Patent No.: US 11,128,265 B2
(45) Date of Patent: Sep. 21, 2021

(54) AMPLIFIER WITH POST-DISTORTION LINEARIZATION

(71) Applicant: Samsung Electronics Co., Ltd., Suwon-si (KR)

(72) Inventors: Youngchang Yoon, Suwon-si (KR); Kyuhwan An, Suwon-si (KR); Jihoon Kim, Suwon-si (KR); Sangho Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 52 days.

(21) Appl. No.: 16/734,484

(22) Filed: Jan. 6, 2020

(65) Prior Publication Data

US 2020/0220505 A1 Jul. 9, 2020

(30) Foreign Application Priority Data

Jan. 7, 2019 (KR) .......................... 10-2019-0001974

(51) Int. Cl.
*H03F 1/22* (2006.01)
*H03F 1/32* (2006.01)
*H03F 3/16* (2006.01)

(52) U.S. Cl.
CPC .......... *H03F 1/3205* (2013.01); *H03F 3/16* (2013.01); *H03F 2201/3215* (2013.01)

(58) Field of Classification Search
CPC ...................................................... H03F 1/22

(Continued)

(56) References Cited

U.S. PATENT DOCUMENTS 6,556,085 B2 *  4/2003  Kwon ................. H03F 1/223
                                                        330/285
7,215,206 B2 *  5/2007  Dupuis ................. H03F 1/52
                                                        330/311

(Continued)

FOREIGN PATENT DOCUMENTS

CN     103401514 A    11/2013
JP     08-097644 A     4/1996

(Continued)

OTHER PUBLICATIONS

Kim, Tae Wook, "Highly Linear Receiver Front-End Adopting MOSFET Transconductance Linearization by Multiple Gated Transistors," IEEE Journal of Solid-State Circuits, vol. 39, No. 1, Feb. 2004, 8 pages.

(Continued)

*Primary Examiner* — Henry Choe

(57) ABSTRACT

A communication method and system for converging a 5th-Generation (5G) communication system for supporting higher data rates beyond a 4th-Generation (4G) system with a technology for Internet of Things (IoT) are provided. The disclosure may be applied to intelligent services based on the 5G communication technology and the IoT-related technology, such as smart home, smart building, smart city, smart car, connected car, health care, digital education, smart retail, security and safety services. An amplifier includes a first transistor for amplifying the fundamental signal applied to a gate terminal, and a second transistor having a source terminal electrically connected to the drain terminal of the first transistor and a drain terminal electrically connected to a bias voltage. The current flowing through the second transistor may be determined based on the current flowing in the drain terminal of the first transistor.

18 Claims, 7 Drawing Sheets

(58) Field of Classification Search
USPC .................................................. 330/311, 310
See application file for complete search history.

(56) References Cited

U.S. PATENT DOCUMENTS

| | | | | |
|---|---|---|---|---|
| 7,714,662 | B2 * | 5/2010 | Jeong ...................... | H03F 3/193 330/302 |
| 8,354,889 | B2 * | 1/2013 | Karthaus ............... | H03F 1/0233 330/297 |
| 8,686,796 | B2 * | 4/2014 | Presti .................. | H03F 3/45179 330/311 |
| 2005/0176399 | A1 | 8/2005 | Aparin | |
| 2007/0030076 | A1 | 2/2007 | Kim et al. | |
| 2008/0079499 | A1 * | 4/2008 | Tsai ........................ | H03F 3/193 330/311 |
| 2009/0140812 | A1 | 6/2009 | Deng et al. | |

FOREIGN PATENT DOCUMENTS

| | | |
|---|---|---|
| JP | 2013-150199 A | 8/2013 |
| KR | 10-1895210 B1 | 9/2018 |

OTHER PUBLICATIONS

International Search Report dated Apr. 21, 2020 in connection with International Patent Application No. PCT/KR2020/000162, 3 pages.
Written Opinion of the International Searching Authority dated Apr. 21, 2020 in connection with International Patent Application No. PCT/KR2020/000162, 5 pages.

* cited by examiner

AMPLIFIER WITH POST-DISTORTION LINEARIZATION

CROSS-REFERENCE TO RELATED APPLICATION(S)

This application is based on and claims priority under 35 U.S.C. § 119 to Korean Patent Application No. 10-2019-0001974 filed on Jan. 7, 2019, in the Korean Intellectual Property Office, the disclosure of which is incorporated by reference herein in its entirety.

BACKGROUND

1. Field

The disclosure relates to a structure of an amplifier that can improve linearity while maintaining amplification efficiency.

2. Description of Related Art

To meet the demand for wireless data traffic having increased since deployment of 4G communication systems, efforts have been made to develop an improved 5th generation (5G) or pre-5G communication system. Therefore, the 5G or pre-5G communication system is also called a 'Beyond 4th generation (4G) Network' or a 'Post LTE System'. The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), Full Dimensional MIMO (FD-MIMO), array antenna, an analog beam forming, large scale antenna techniques are discussed in 5G communication systems. In addition, in 5G communication systems, development for system network improvement is under way based on advanced small cells, cloud Radio Access Networks (RANs), ultra-dense networks, device-to-device (D2D) communication, wireless backhaul, moving network, cooperative communication, Coordinated Multi-Points (CoMP), reception-end interference cancellation and the like. In the 5G system, Hybrid frequency shift keying (FSK) and quadrature amplitude modulation (QAM) Modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

The Internet, which is a human centered connectivity network where humans generate and consume information, is now evolving to the Internet of Things (IoT) where distributed entities, such as things, exchange and process information without human intervention. The Internet of Everything (IoE), which is a combination of the IoT technology and the Big Data processing technology through connection with a cloud server, has emerged. As technology elements, such as "sensing technology", "wired/wireless communication and network infrastructure", "service interface technology", and "Security technology" have been demanded for IoT implementation, a sensor network, a Machine-to-Machine (M2M) communication, Machine Type Communication (MTC), and so forth have been recently researched. Such an IoT environment may provide intelligent Internet technology services that create a new value to human life by collecting and analyzing data generated among connected things. IoT may be applied to a variety of fields including smart home, smart building, smart city, smart car or connected cars, smart grid, health care, smart appliances and advanced medical services through convergence and combination between existing Information Technology (IT) and various industrial applications.

In line with this, various attempts have been made to apply 5G communication systems to IoT networks. For example, technologies such as a sensor network, MTC, and M2M communication may be implemented by beamforming, MIMO, and array antennas. Application of a cloud RAN as the above-described Big Data processing technology may also be considered to be as an example of convergence between the 5G technology and the IoT technology.

SUMMARY

Accordingly, the disclosure provides an amplifier structure that can improve linearity by removing nonlinear components generated due to signal amplification by using a post-distorter.

According to the disclosure, there is provided an amplifier. The amplifier may include: a first transistor for amplifying the fundamental signal applied to a gate terminal, and a second transistor having a source terminal electrically connected to the drain terminal of the first transistor and a drain terminal electrically connected to a bias voltage, wherein the current flowing through the second transistor may be determined based on the current flowing in the drain terminal of the first transistor.

According to the disclosure, there is provided an electronic device having an amplifier. The amplifier may include: a first transistor for amplifying the fundamental signal applied to a gate terminal; and a second transistor having a source terminal electrically connected to the drain terminal of the first transistor and a drain terminal electrically connected to a bias voltage, wherein the current flowing through the second transistor may be determined based on the current flowing in the drain terminal of the first transistor.

According to an embodiment of the disclosure, it is possible to minimize the influence of intermodulation components generated during the amplification process on the output of the amplifier, thereby improving the linearity of the amplifier.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
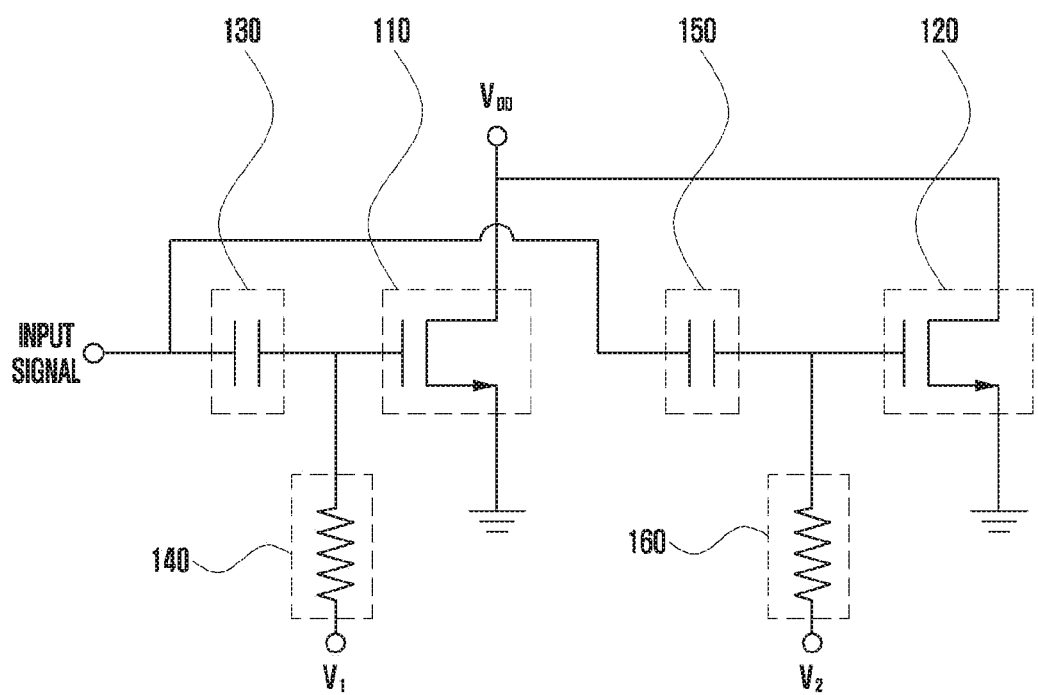
FIG. 1 illustrates the structure of an amplifier according to the related art.

FIGS. 1 through 7, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Hereinafter, embodiments of the disclosure will be described in detail. Descriptions of functions and structures well known in the art and not directly related to the disclosure may be omitted for clarity and conciseness without obscuring the subject matter of the disclosure.

In the drawings, some elements are exaggerated, omitted, or only outlined in brief, and thus may be not drawn to scale. The same or similar reference symbols are used throughout the drawings to refer to the same or like parts.

The aspects, features, and advantages of certain embodiments of the disclosure will be more apparent from the following detailed description taken in conjunction with the accompanying drawings. The description of the various embodiments is to be construed as exemplary only and does not describe every possible instance of the disclosure. It should be apparent to those skilled in the art that the following description of various embodiments of the disclosure is provided for illustrative purposes only and not for the purpose of limiting the disclosure as defined by the appended claims and their equivalents. The same reference symbols are used throughout the description to refer to the same parts.

Meanwhile, it is known to those skilled in the art that blocks of a flowchart (or sequence diagram) and a combination of flowcharts may be represented and executed by computer program instructions. These computer program instructions may be loaded on a processor of a general purpose computer, special purpose computer, or programmable data processing equipment. When the loaded program instructions are executed by the processor, they create a means for carrying out functions described in the flowchart. As the computer program instructions may be stored in a computer readable memory that is usable in a specialized computer or a programmable data processing equipment, it is also possible to create articles of manufacture that carry out functions described in the flowchart. As the computer program instructions may be loaded on a computer or a programmable data processing equipment, when executed as processes, they may carry out steps of functions described in the flowchart.

A block of a flowchart may correspond to a module, a segment or a code containing one or more executable instructions implementing one or more logical functions, or to a part thereof. In some cases, functions described by blocks may be executed in an order different from the listed order. For example, two blocks listed in sequence may be executed at the same time or executed in reverse order.

In the description, the word "unit", "module", or the like may refer to a software component or hardware component such as an FPGA or ASIC capable of carrying out a function or an operation. However, "unit" or the like is not limited to hardware or software. A unit or the like may be configured so as to reside in an addressable storage medium or to drive one or more processors. Units or the like may refer to software components, object-oriented software components, class components, task components, processes, functions, attributes, procedures, subroutines, program code segments, drivers, firmware, microcode, circuits, data, databases, data structures, tables, arrays, or variables. A function provided by a component and unit may be a combination of smaller components and units, and it may be combined with others to compose large components and units. Components and units may be configured to drive a device or one or more processors in a secure multimedia card. In one embodiment, a unit or module may include one or more processors.

FIG. 1 illustrates the structure of an amplifier according to the related art.

In the related art, the input signal may be supplied to the gate terminals of a first transistor 110 and a second transistor 120. More specifically, the input signal may be supplied to the gate terminal of the first transistor 110 through the first capacitance 130 and to the gate terminal of the second transistor 120 through the second capacitance 150.

In the related art, the first input bias $V_1$ for driving the first transistor 110 may be supplied to the gate terminal of the first transistor 110 through the first impedance 140. The second input bias $V_2$ for driving the second transistor 120 may be supplied to the gate terminal of the second transistor 120 through the second impedance 160.

In the related art, the input signal may be amplified according to the operation of the first transistor 110 and the second transistor 120. For example, the fundamental signal and intermodulation signal may also be amplified according to the amplification of the input signal.

The intermodulation signal is a signal generated by amplification of the fundamental signal and can reduce the linearity of the amplifier. For example, the linearity of the amplifier may be reduced by the third-order intermodulation signal component generated by the operation of the transistor.

Figure 2:
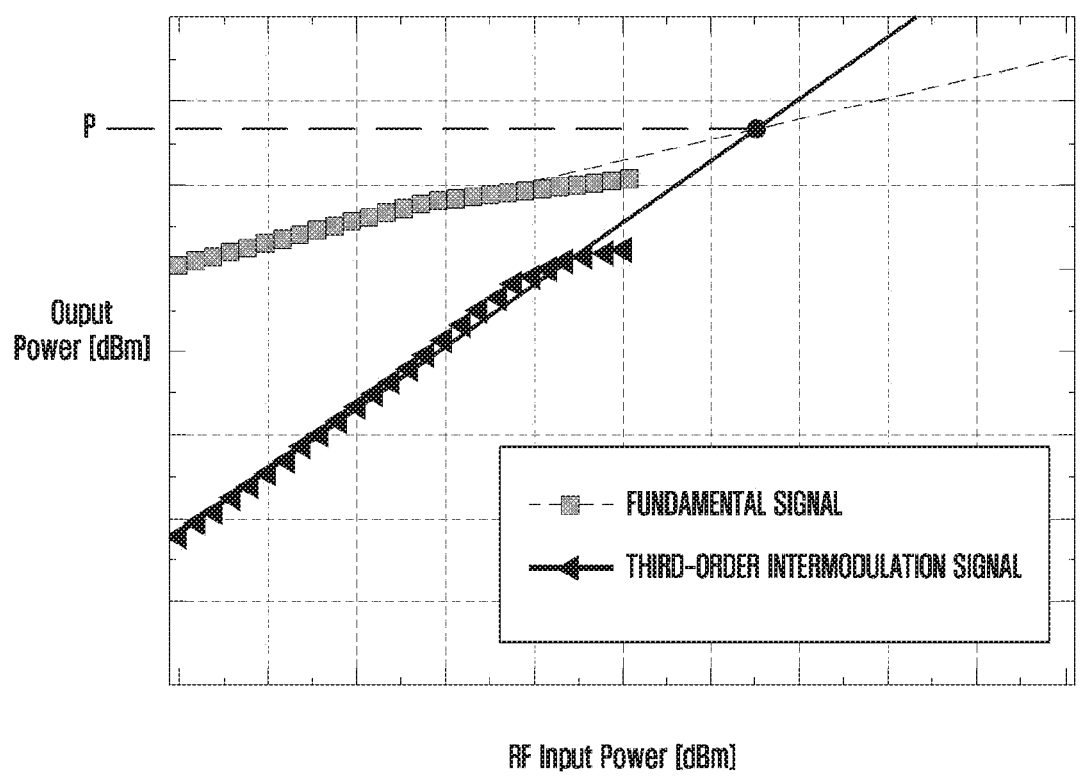
FIG. 2 illustrates a graph showing the change rates of a fundamental signal and an intermodulation signal in the amplifier structure according to the related art.

FIG. 2 illustrates a graph showing the change rates of the fundamental signal and intermodulation signal in the amplifier structure according to the related art.

In one embodiment, as the output power of the amplifier increases with amplification, the third-order intermodulation signal may also increase. Here, the rate of increase of the third-order intermodulation signal may be higher than that of the fundamental signal. Hence, if the output power is continuously increased, the output power of the third intermodulation signal may be greater than the output power of the fundamental signal. (However, in reality, as shown in FIG. 2, when the output power increases above a preset value, because the fundamental signal and the third intermodulation signal are saturated, the output power of the third intermodulation signal cannot be greater than the output power of the fundamental signal.)

The rate of increase of the third-order intermodulation signal is greater than that of the fundamental signal because the fundamental signal increases in proportion to the magnitude of the input signal whereas the third-order intermodulation signal increases in proportion to the third power of the magnitude of the input signal. That is, in FIG. 2 where the graph is shown in dB scale, the slope of the graph for the third-order intermodulation signal may be three times the slope of the graph for the fundamental signal.

As described above, the output power of the third-order intermodulation signal cannot be greater than the output power of the fundamental signal. However, based on the slope of the change in the output power of the third-order intermodulation signal and the slope of the change in the output power of the fundamental signal, it is possible to estimate the output power value at which the output power of the third-order intermodulation signal becomes equal to the output power of the fundamental signal.

That is, the P value in FIG. 2 may indicate the output third-order intercept point (OIP3), and the linearity characteristic of the amplifier may be evaluated based on the P value. For example, it may be determined that the larger the P value, the better the linearity characteristic of the amplifier.

Meanwhile, only OIP3 is described as a variable for improving linearity, but the input third-order intercept point (IIP3) may also be considered to identify whether linearity is improved.

Figure 3:
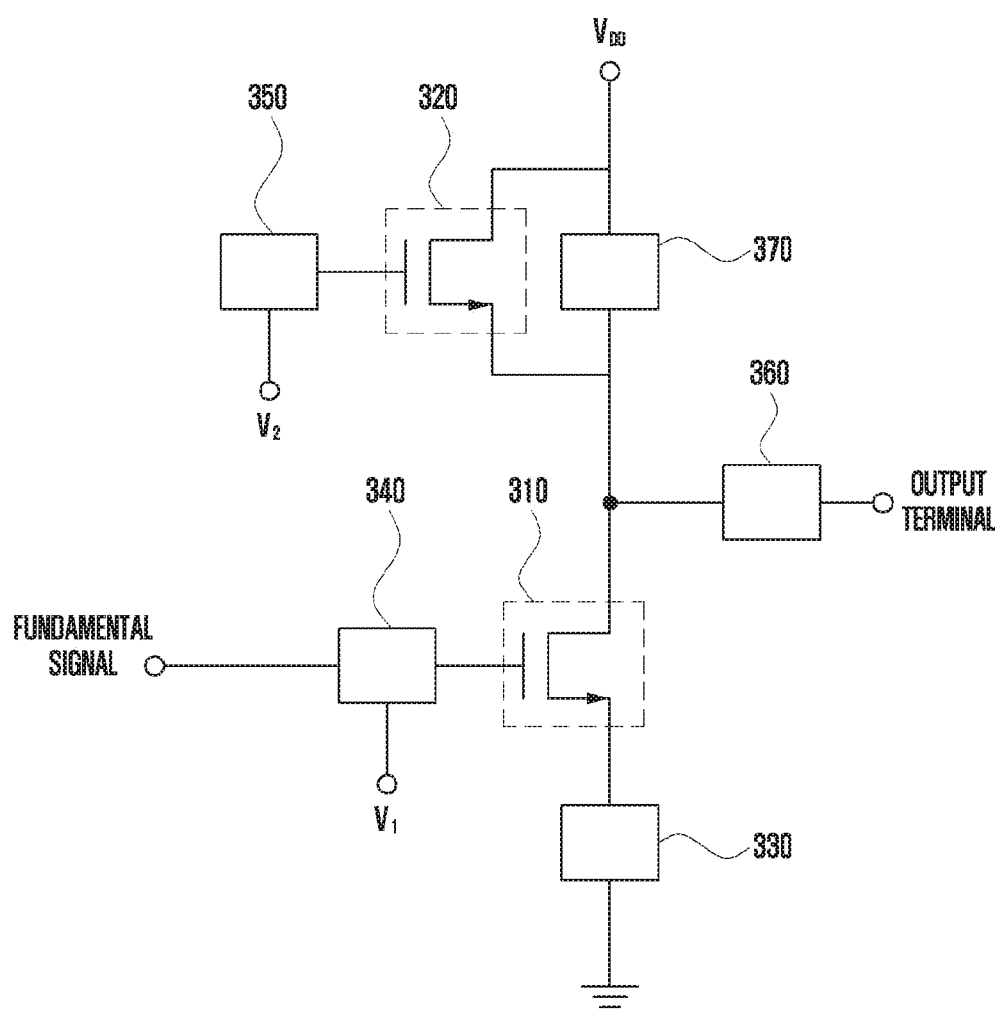
FIG. 3 illustrates the structure of an amplifier according to an embodiment of the disclosure.

FIG. 3 illustrates the structure of an amplifier according to an embodiment of the disclosure.

In one embodiment, the amplifier may include a first transistor 310 for amplifying the fundamental signal applied to the gate terminal, and a second transistor 320 having a source terminal electrically connected to the drain terminal of the first transistor 310 and a drain terminal electrically connected to a bias voltage. Here, the current flowing through the second transistor 320 may be determined based on the current flowing in the drain terminal of the first transistor 310.

In one embodiment, an intermodulation current generated by amplification of the fundamental signal supplied to the gate terminal of the first transistor 310 may flow from the drain terminal of the first transistor 310 to the source terminal of the second transistor 320. Here, the intermodulation current flowing from the drain terminal of the first transistor to the source terminal of the second transistor may be the current of the third-order intermodulation signal generated by amplification of the fundamental signal.

In one embodiment, the fundamental signal may be supplied to the gate terminal of the first transistor 310 through the first impedance 340. The first bias voltage $V_1$ for driving the first transistor 310 may be supplied to the gate terminal of the first transistor 310 through the first impedance 340.

In one embodiment, the second bias voltage $V_2$ for driving the second transistor 320 may be supplied to the gate terminal of the second transistor 320 through the second impedance 350.

In one embodiment, the third-order transconductance (gm3) component of the transistor having a nonlinear characteristic may vary according to the first bias voltage $V_1$ supplied to the first transistor 310 and the second bias voltage $V_2$ supplied to the second transistor 320.

In one embodiment, the linearity of the amplifier can be improved by causing the first bias voltage $V_1$ supplied to the first transistor 310 and the second bias voltage $V_2$ supplied to the second transistor 320 to have different values so as to reduce the third-order transconductance component of the transistor.

In one embodiment, when the first bias voltage $V_1$ applied to the first transistor 310 exceeds the threshold voltage $V_{th1}$ of the first transistor, the second bias voltage $V_2$ applied to the second transistor 320 may be lower than or equal to the threshold voltage $V_2$ of the second transistor. That is, when the first bias voltage is applied to the strong inversion region of the first transistor, the second bias voltage may be applied to the weak inversion region of the second transistor.

In one embodiment, when the first bias voltage $V_1$ applied to the first transistor 310 is lower than or equal to the threshold voltage $V_{th1}$ of the first transistor, the second bias voltage $V_2$ applied to the second transistor 320 may exceed the threshold voltage $V_{th2}$ of the second transistor. That is, when the first bias voltage is applied to the weak inversion region of the first transistor, the second bias voltage may be applied to the strong inversion region of the second transistor.

In one embodiment, the third-order intermodulation current generated in each of the first transistor 310 and the second transistor 320 may be determined based on the size of the transistor and the magnitude of the signal applied to the transistor. For example, the magnitude of the third-order intermodulation current generated in the first transistor 310 may be determined based on the voltage between the gate terminal and the source terminal of the first transistor 310, and the magnitude of the third-order intermodulation current generated in the second transistor 320 may be determined based on the voltage between the gate terminal and the source terminal of the second transistor 320.

In one embodiment, by varying the size or bias of the second transistor 320, the third-order intermodulation current generated in the second transistor 320 may be adjusted to have a magnitude similar to that of the third-order intermodulation current generated in the first transistor 310.

In particular, when the third-order intermodulation current generated in the second transistor 320 is adjusted to have a magnitude similar to that of the third-order intermodulation current generated in the first transistor 310, the third-order intermodulation current generated in the first transistor 310 may flow through the second transistor and may not affect the output of the amplifier. In other words, the linearity of the amplifier can be improved.

In one embodiment, the first impedance 340 and the second impedance 350 may include resistance, inductance, or capacitance components. In various embodiments, the first bias voltage applied to the first transistor 310 may be adjusted by the first impedance 340, and the second bias voltage applied to the second transistor 320 may be adjusted by the second impedance 350.

In one embodiment, the amplifier may include a third impedance 330 between the source terminal of the first transistor 310 and the ground. For example, the third impedance 330 may include an inductor.

In one embodiment, a fourth impedance 360 may be included between the output terminal of the amplifier and the drain terminal of the first transistor 310. The circuit stability of the amplifier may be improved due to the fourth impedance 360. For example, the fourth impedance 360 may include a capacitor.

In one embodiment, a fifth impedance 370 may be electrically connected between the bias voltage $V_{DD}$ and the drain terminal of the first transistor 310. For example, the fifth impedance 370 may include an inductor.

In one embodiment, the size of the second transistor 320 may be smaller than the size of the first transistor 310. In another embodiment, a first voltage, which is the voltage difference between the gate terminal and the source terminal of the first transistor 310, may be higher than a second voltage, which is the voltage difference between the gate terminal and the source terminal of the second transistor 320.

In one embodiment, due to the difference between the first voltage and the second voltage, although the size of the second transistor is smaller than the size of the first transistor, the first transistor 310 and the second transistor 320 may generate third-order intermodulation currents of the same magnitude.

Figure 4:
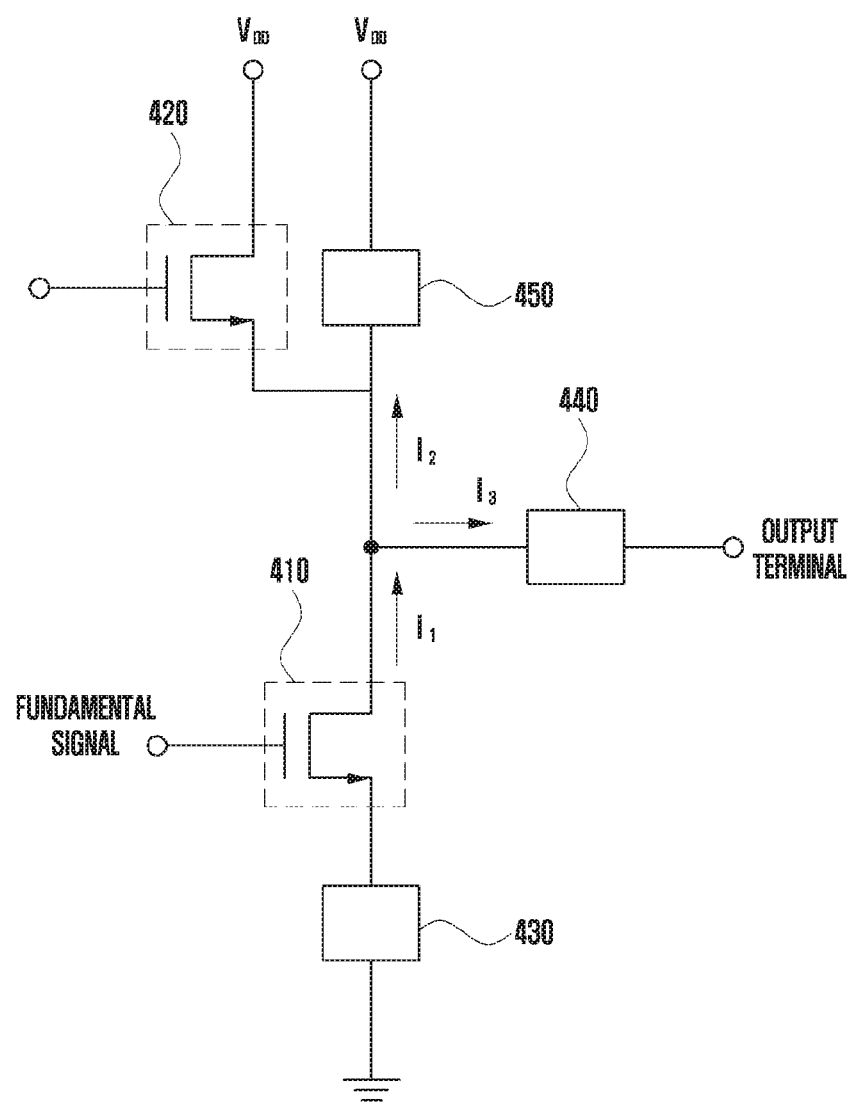
FIG. 4 illustrates the flow of intermodulation current in the amplifier structure according to an embodiment of the disclosure.

FIG. 4 shows the flow of intermodulation current in the amplifier structure according to an embodiment of the disclosure.

In one embodiment, the first current $i_1$ amplified by the first transistor 410 may flow from the drain terminal of the first transistor 410 toward the output terminal. The first current $i_1$ may include the current of the fundamental signal amplified by the first transistor 410 and an intermodulation current. For example, the intermodulation current may be a third-order intermodulation current of the first transistor. In particular, the linearity of the amplifier may be reduced due to the intermodulation current.

In one embodiment, the first current $i_1$ may be divided into a second current $i_2$ flowing to the source terminal of the second transistor 420 and a third current $i_3$ flowing to the output terminal of the amplifier. The current of the amplified fundamental signal included in the first current $i_1$ may flow to the output terminal of the amplifier. That is, the third current $i_3$ may include only the current of the amplified fundamental signal.

In one embodiment, the intermodulation current included in the first current $i_1$ may flow to the second transistor 420. That is, the second current $i_2$ may include only the intermodulation current. Although the magnitude of the fundamental signal current flowing through the second transistor 420 is less than the magnitude of the fundamental signal current flowing through the first transistor 410, due to the difference between the fundamental signal voltage applied to the second transistor 420 (e.g., voltage difference between the gate terminal and the source terminal of the second transistor) and the fundamental signal voltage applied to the first transistor 410, the magnitude of the third-order intermodulation current generated by the operation of the first transistor 410 may be similar to the magnitude of the third-order intermodulation current generated by the operation of the second transistor 420.

In one embodiment, the fundamental signal current flowing in the first transistor 410 and the fundamental signal current flowing in the second transistor 420 may be in phase. In particular, the third-order intermodulation current of the first transistor 410 and the third-order intermodulation current of the second transistor 420 generated by odd-order nonlinearity may also be in phase.

In one embodiment, the third-order intermodulation current flowing in the first transistor 410 and the third-order intermodulation current flowing in the second transistor 420 are in phase, whereby the intermodulation current component included in the first current $i_1$ may flow to the second transistor 420. Most of the fundamental signal current components included in the first current $i_1$ may flow to the output terminal of the amplifier. That is, most of the fundamental signal current components flow to the output terminal of the amplifier and most of the intermodulation current components flow to the second transistor 420, thereby improving the linearity of the amplifier.

In one embodiment, an inductor 430 may be disposed between the source terminal of the first transistor 410 and the ground to reduce a transconductance component due to the operation of the amplifier. In one embodiment, the capacitance 440 may be included between the drain terminal of the first transistor 410 and the output terminal of the amplifier. In one embodiment, the impedance 450 may be included between the bias voltage $V_{DD}$ and the output terminal of the amplifier. In various embodiments, the circuit stability of the amplifier may be improved through the capacitance 440 and the impedance 450. For example, the impedance 450 may include an inductor.

Figure 5:
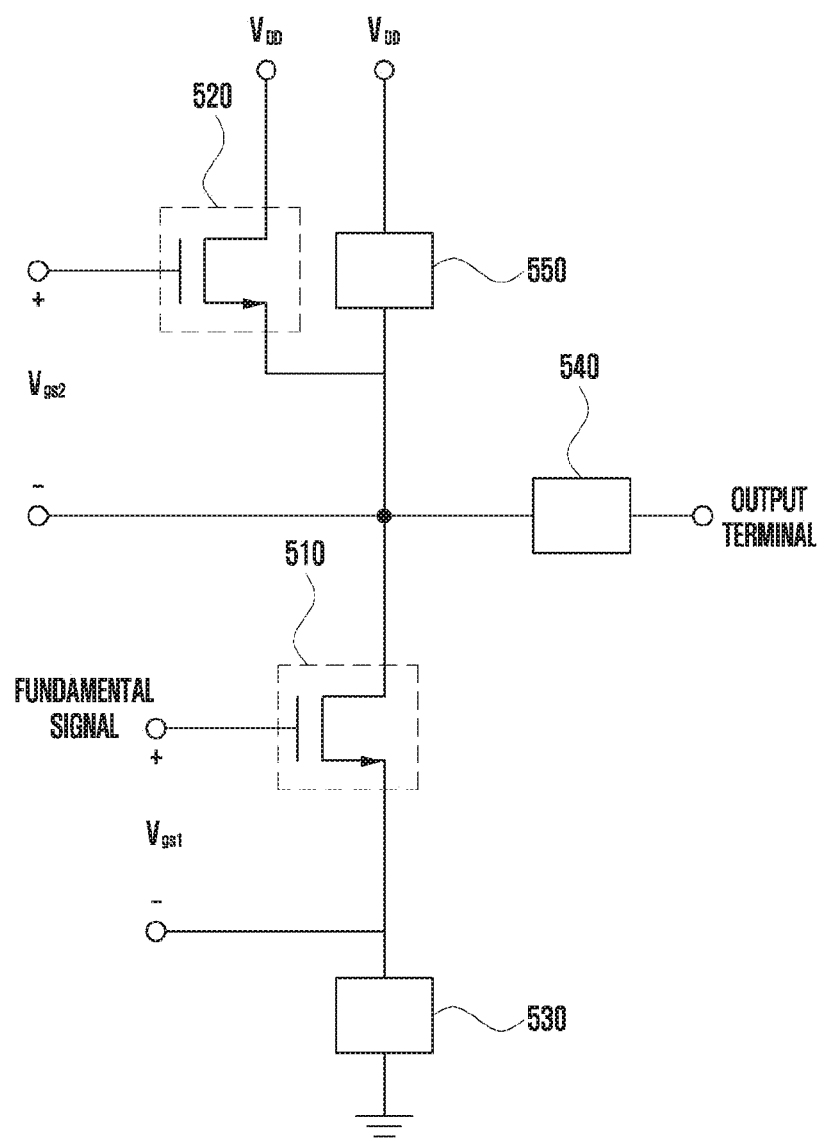
FIG. 5 illustrates the voltage value of each node in the amplifier structure according to an embodiment of the disclosure.

FIG. 5 illustrates the voltage value of each node in the amplifier structure according to an embodiment of the disclosure.

In one embodiment, the fundamental signal may be amplified by the first transistor 510. In various embodiments, the first voltage $V_{gs1}$, which is the voltage difference between the gate terminal and the source terminal of the first transistor 510, may be lower than the second voltage $V_{gs2}$, which is the voltage difference between the gate terminal and the source terminal of the second transistor 520.

In one embodiment, as the first voltage $V_{gs1}$ is lower than the second voltage $V_{gs2}$, although the fundamental signal current flowing in the second transistor 520 is less than that flowing in the first transistor 510, the magnitude of the intermodulation current flowing in the second transistor 520 may be the same as or similar to the magnitude of the intermodulation current flowing in the first transistor 510. In one embodiment, although the size of the second transistor 520 is smaller than the size of the first transistor 510, the first transistor 510 and the second transistor 520 may generate third-order intermodulation currents of the same or similar magnitude due to the difference between the second voltage $V_{gs2}$ and the first voltage $V_{gs1}$.

In one embodiment, an inductor 530 may be disposed between the source terminal of the first transistor 510 and the ground. In particular, the linearity of the amplifier may be improved by reducing the third-order transconductance component of the first transistor 510 through the inductor 530.

In one embodiment, the capacitance 540 may be included between the output terminal of the amplifier and the drain terminal of the first transistor 510. In one embodiment, the impedance 550 may be included between the bias voltage $V_{DD}$ and the output terminal of the amplifier. In various embodiments, the circuit stability of the amplifier may be improved by the capacitance 540 and the impedance 550. For example, the impedance 550 may include an inductor.

Figure 6:
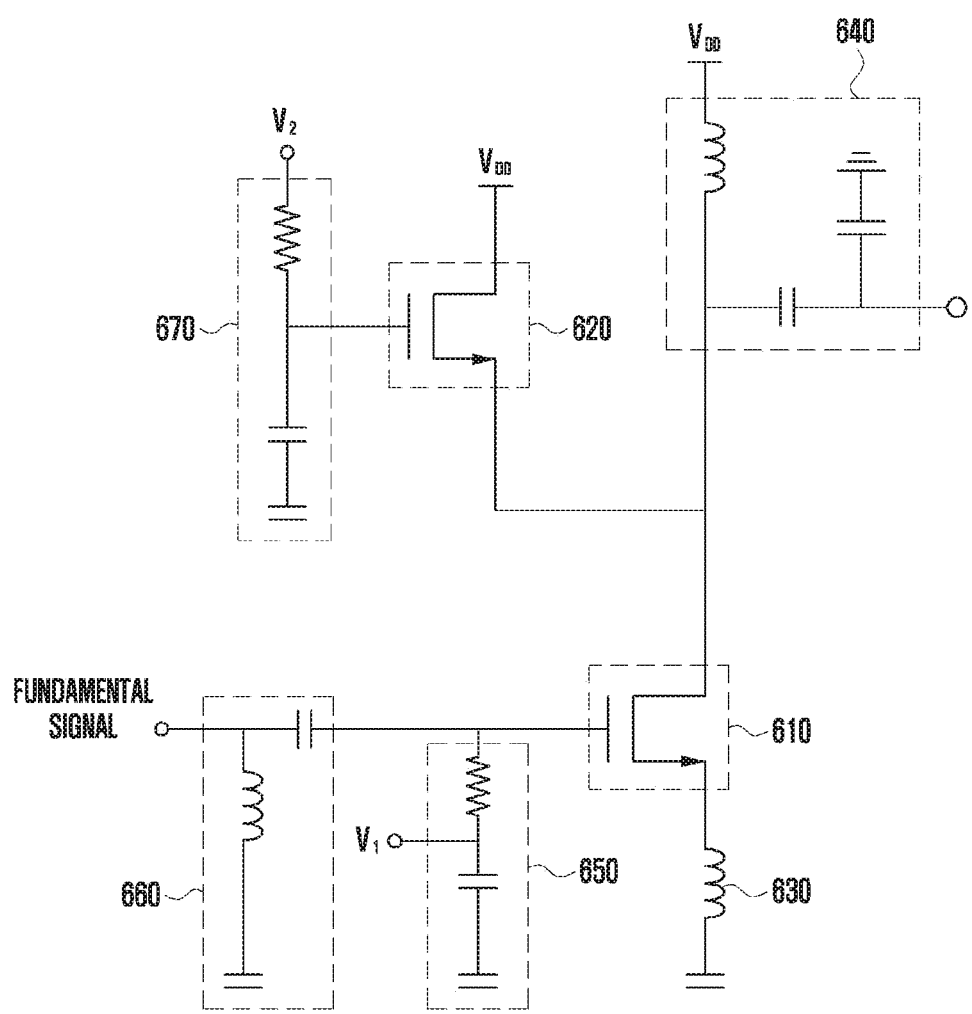
FIG. 6 illustrates the structure of an amplifier according to an embodiment of the disclosure.

FIG. 6 illustrates the structure of an amplifier according to an embodiment of the disclosure.

In one embodiment, the fundamental signal may be supplied to the gate terminal of the first transistor 610 through the first impedance 660. The first impedance 660 may include an inductor and a capacitor as shown in FIG. 6. In one embodiment, impedance matching for the input terminal of the amplifier may be performed through the first impedance 660.

In one embodiment, the first bias voltage $V_1$ for driving the first transistor may be supplied to the gate terminal of the first transistor through the second impedance 650. As shown in FIG. 6, the second impedance 650 may include a resistor and a capacitor.

In one embodiment, the current amplified by the first transistor 610 may flow from the drain terminal of the first transistor 610 toward the output terminal. In various embodiments, the amplified current may include an intermodulation current.

In one embodiment, the intermodulation current generated by the amplification operation of the first transistor 610 may include a third-order intermodulation current, and the linearity of the amplifier may be reduced by the third-order intermodulation current. In various embodiments, an inductor 630 may be disposed between the source terminal of the first transistor 610 and the ground to reduce the transconductance component due to the operation of the amplifier.

In one embodiment, the second bias voltage $V_2$ for driving the second transistor 620 may be supplied to the gate terminal of the second transistor 620 through the third impedance 670. As shown in FIG. 6, the third impedance 670 may include a resistor and a capacitor.

In one embodiment, the third-order intermodulation current generated in each of the first transistor 610 and the second transistor 620 may be determined based on the size of the transistor and the magnitude of the signal applied to the transistor. For example, the magnitude of the third-order intermodulation current generated in the first transistor 610 may be determined based on the voltage between the gate terminal and the source terminal of the first transistor 610, and the magnitude of the third-order intermodulation current generated in the second transistor 620 may be determined based on the voltage between the gate terminal and the source terminal of the second transistor 620.

In one embodiment, by varying the size or bias of the second transistor 620, the magnitude of the third-order intermodulation current generated in the second transistor 620 may be adjusted to be equal or similar to the magnitude of the third-order intermodulation current generated in the first transistor 610. In particular, when the magnitude of the third-order intermodulation current generated in the second transistor 620 is adjusted to be similar to the magnitude of the third-order intermodulation current generated in the first transistor 610, the third-order intermodulation current generated in the first transistor 610 may flow through the second transistor and may not affect the output terminal of the amplifier. In other words, the linearity of the amplifier can be improved.

In one embodiment, the fourth impedance 640 may be included between the output terminal of the amplifier and the drain terminal of the first transistor 610. Impedance matching for the output terminal of the amplifier may be performed through the fourth impedance 640. For example, the fourth impedance 640 may include a resistor, an inductor, and a capacitor.

Figure 7:
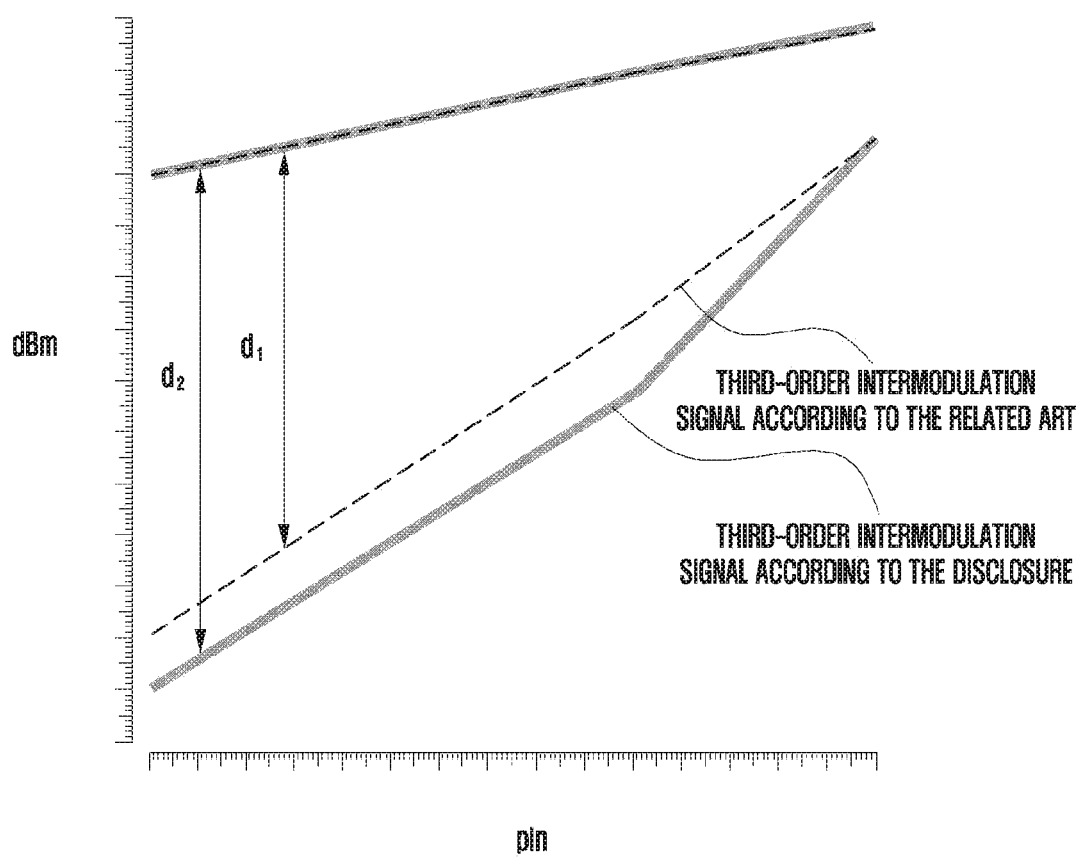
FIG. 7 illustrates a graph showing the result of linearity improvement of the amplifier according to an embodiment of the disclosure.

FIG. 7 illustrates a graph showing the result of linearity improvement of the amplifier according to an embodiment of the disclosure.

According to the disclosure, it can be seen from FIG. 7 that the magnitude of the third-order intermodulation signal is small in comparison to the fundamental signal. For example, according to the related art, when the input power is a1, the difference between the fundamental signal and the third-order intermodulation signal may be $d_1$. On the other hand, according to the disclosure, when the input power is a1, the difference between the fundamental signal and the third-order intermodulation signal may be $d_2$. Here, $d_2$ may be greater than $d_1$.

Both $d_1$ and $d_2$ indicate the difference between the fundamental signal and the third-order intermodulation signal. A larger difference between the fundamental signal and the third-order intermodulation signal means that the magnitude of the third-order intermodulation signal is smaller compared with the fundamental signal of the same magnitude. This may indicate that the linearity is better.

The disclosure provides an amplifier. The amplifier includes: a first transistor for amplifying the fundamental signal applied to a gate terminal, and a second transistor having a source terminal electrically connected to the drain terminal of the first transistor and a drain terminal electrically connected to a bias voltage, wherein the current flowing through the second transistor may be determined based on the current flowing in the drain terminal of the first transistor.

In one embodiment, an intermodulation current generated in response to the amplification operation of the first transistor may flow from the drain terminal of the first transistor to the source terminal of the second transistor.

In one embodiment, the intermodulation current may be a current of a third-order intermodulation signal generated by amplification of the fundamental signal.

In one embodiment, the current flowing in the first transistor due to the operation of the amplifier and the current flowing in the second transistor due to the operation of the amplifier may be in-phase.

In one embodiment, a first voltage, which is the voltage difference between the gate terminal and the source terminal of the first transistor, may be lower than a second voltage, which is the voltage difference between the gate terminal and the source terminal of the second transistor.

In one embodiment, the size of the second transistor may be smaller than the size of the first transistor.

In one embodiment, the amplifier may further include a capacitor disposed between the drain terminal of the first transistor and the output terminal of the amplifier, wherein the fundamental signal current amplified by the first transistor may flow through the capacitor to the output terminal of the amplifier.

In one embodiment, the amplifier may further include an inductor electrically connected between the source terminal of the first transistor and the ground.

The disclosure provides an electronic device including an amplifier. The amplifier includes: a first transistor for amplifying the fundamental signal applied to a gate terminal; and a second transistor having a source terminal electrically connected to the drain terminal of the first transistor and a drain terminal electrically connected to a bias voltage, wherein the current flowing through the second transistor may be determined based on the current flowing in the drain terminal of the first transistor.

In one embodiment, an intermodulation current generated in response to the amplification operation of the first transistor may flow from the drain terminal of the first transistor to the source terminal of the second transistor.

In one embodiment, the intermodulation current may be a current of a third-order intermodulation signal generated by amplification of the fundamental signal.

In one embodiment, the current flowing in the first transistor due to the operation of the amplifier and the current flowing in the second transistor due to the operation of the amplifier may be in-phase.

In one embodiment, a first voltage, which is the voltage difference between the gate terminal and the source terminal of the first transistor, may be lower than a second voltage, which is the voltage difference between the gate terminal and the source terminal of the second transistor.

In one embodiment, the size of the second transistor may be smaller than the size of the first transistor.

In one embodiment, the amplifier may further include a capacitor disposed between the drain terminal of the first transistor and the output terminal of the amplifier, wherein the fundamental signal current amplified by the first transistor may flow through the capacitor to the output terminal of the amplifier.

In one embodiment, the amplifier may further include an inductor electrically connected between the source terminal of the first transistor and the ground.

Hereinabove, embodiments of the disclosure have been described with reference to the accompanying drawings for the purpose of illustration without limiting the subject matter of the disclosure. It should be understood that many variations and modifications of the basic inventive concept described herein will still fall within the spirit and scope of the disclosure as defined in the appended claims and their equivalents. In addition, the above embodiments may be combined with each other as necessary. For example, the embodiments of the disclosure may be partially or fully combined and applied to the base station and the terminal.

Although the present disclosure has been described with various embodiments, various changes and modifications may be suggested to one skilled in the art. It is intended that the present disclosure encompass such changes and modifications as fall within the scope of the appended claims.

What is claimed is:

1. An amplifier comprising:
a first transistor for amplifying a fundamental signal applied to a gate terminal; and
a second transistor including a source terminal electrically connected to a drain terminal of the first transistor and a drain terminal electrically connected to a bias voltage,
wherein a second electric current flowing through the second transistor is determined based on a first electric current flowing in the drain terminal of the first transistor,
wherein the first electric current is generated in response to an amplification operation of the first transistor, and the first current includes an intermodulation current and a fundamental signal current,
wherein the intermodulation current flows from the drain terminal of the first transistor to the source terminal of the second transistor, and
wherein the fundamental signal current flows from the drain terminal of the first transistor to an output terminal of the amplifier.

2. The amplifier of claim 1, wherein the intermodulation current is an electric current of a third-order intermodulation signal generated by the amplification operation of the fundamental signal.

3. The amplifier of claim 1, wherein an electric current flowing in the first transistor due to the amplification operation and an electric current flowing in the second transistor due to the amplification operation are an in-phase.

4. The amplifier of claim 1, wherein a first voltage being a voltage difference between the gate terminal and the source terminal of the first transistor is lower than a second voltage being a voltage difference between the gate terminal and the source terminal of the second transistor.

5. The amplifier of claim 1, wherein a size of the second transistor is smaller than a size of the first transistor.

6. The amplifier of claim 1, further comprising a capacitor disposed between the drain terminal of the first transistor and the source terminal of the second transistor and the output terminal of the amplifier, and wherein the fundamental signal current flows to the output terminal of the amplifier through the capacitor.

7. The amplifier of claim 1, further comprising an inductor electrically connected between the source terminal of the first transistor and a ground.

8. The amplifier of claim 1, wherein the first transistor and the second transistor generate third-order intermodulation electric currents with a same magnitude based on a difference between a first voltage and a second voltage.

9. The amplifier of claim 1, further comprising an inductor electrically connected between the bias voltage and the drain terminal of the first transistor.

10. An electronic device comprising an amplifier, wherein the amplifier comprises:
a first transistor for amplifying a fundamental signal applied to a gate terminal; and
a second transistor including a source terminal electrically connected to a drain terminal of the first transistor and a drain terminal electrically connected to a bias voltage,
wherein a second electric current flowing through the second transistor is determined based on a first electric current flowing in the drain terminal of the first transistor,
wherein the first electric current, generated in response to an amplification operation of the first transistor, includes an intermodulation current and a fundamental signal current,
wherein the intermodulation current flows from the drain terminal of the first transistor to the source terminal of the second transistor, and
wherein the fundamental signal current flows from the drain terminal of the first transistor to an output terminal of the amplifier.

11. The electronic device of claim 10, wherein the intermodulation current is an electric current of a third-order intermodulation signal generated by the amplification operation of the fundamental signal.

12. The electronic device of claim 10, wherein an electric current flowing in the first transistor due to the amplification operation and an electric current flowing in the second transistor due to the amplification operation are an in-phase.

13. The electronic device of claim 10, wherein a first voltage being a voltage difference between the gate terminal and the source terminal of the first transistor is lower than a second voltage being a voltage difference between the gate terminal and the source terminal of the second transistor.

14. The electronic device of claim 10, wherein a size of the second transistor is smaller than a size of the first transistor.

15. The electronic device of claim 10, wherein the amplifier further comprises a capacitor disposed between the drain terminal of the first transistor and the source terminal of the second transistor and the output terminal of the amplifier, and wherein the fundamental signal current flows to the output terminal of the amplifier through the capacitor.

16. The electronic device of claim 10, wherein the amplifier further comprises an inductor electrically connected between the source terminal of the first transistor and a ground.

17. The electronic device of claim 10, wherein the first transistor and the second transistor generate third-order intermodulation electric currents with a same magnitude based on a difference between a first voltage and a second voltage.

18. The electronic device of claim 10, further comprising an inductor electrically connected between the bias voltage and the drain terminal of the first transistor.

* * * * *